United States Patent
Kamono

(10) Patent No.: US 6,833,903 B2
(45) Date of Patent: Dec. 21, 2004

(54) INERT GAS PURGE METHOD AND APPARATUS, EXPOSURE APPARATUS, RETICLE STOCKER, RETICLE INSPECTION APPARATUS, RETICLE TRANSFER BOX, AND DEVICE MANUFACTURING METHOD

(75) Inventor: Takashi Kamono, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 17 days.

(21) Appl. No.: 10/356,571

(22) Filed: Feb. 3, 2003

(65) Prior Publication Data

US 2003/0150329 A1 Aug. 14, 2003

(30) Foreign Application Priority Data

Feb. 5, 2002 (JP) ........................................ 2002-028328

(51) Int. Cl.⁷ ........................ G03B 27/52; G03B 27/42; G03B 27/62
(52) U.S. Cl. ............................. 355/30; 355/53; 355/75
(58) Field of Search ............................. 355/30, 53, 72, 355/75; 430/5

(56) References Cited

U.S. PATENT DOCUMENTS

| | | | | |
|---|---|---|---|---|
| 5,559,584 A | * | 9/1996 | Miyaji et al. ................. | 355/73 |
| 6,507,390 B1 | * | 1/2003 | Ivaldi ........................... | 355/75 |
| 6,614,504 B2 | * | 9/2003 | Aoki et al. .................... | 355/30 |
| 6,633,364 B2 | * | 10/2003 | Hayashi ........................ | 355/53 |
| 2002/0057425 A1 | * | 5/2002 | Nakano ......................... | 355/72 |
| 2002/0085183 A1 | * | 7/2002 | Wu et al. ...................... | 355/30 |

FOREIGN PATENT DOCUMENTS

| | | |
|---|---|---|
| JP | 6-252028 | 9/1994 |
| JP | 9-73167 | 3/1997 |
| JP | 9-197652 | 7/1997 |

OTHER PUBLICATIONS

Hideo Okabe, "Photochemistry of Small Molecules", Wiley– Interscience Publication (1978), p. 178.

* cited by examiner

*Primary Examiner*—Alan Mathews
(74) *Attorney, Agent, or Firm*—Fitzpatrick, Cella, Harper & Scinto

(57) ABSTRACT

The object of this invention is to provide a technique of effectively purging a space almost closed with a master and pellicle film with inert gas in an exposure apparatus which uses ultraviolet rays as exposure light, purges the interior of the apparatus with inert gas, and projects the pattern of a master onto a photosensitive substrate via a projection optical system. To achieve this object, a plurality of vent holes are formed in a structure obtained by surrounding by a surrounding member a gas purge space to be purged with inert gas. A vessel which forms a space around the structure is filled with inert gas to cause inert gas to enter the gas purge space, purging the gas purge space with inert gas.

19 Claims, 15 Drawing Sheets

F I G. 4
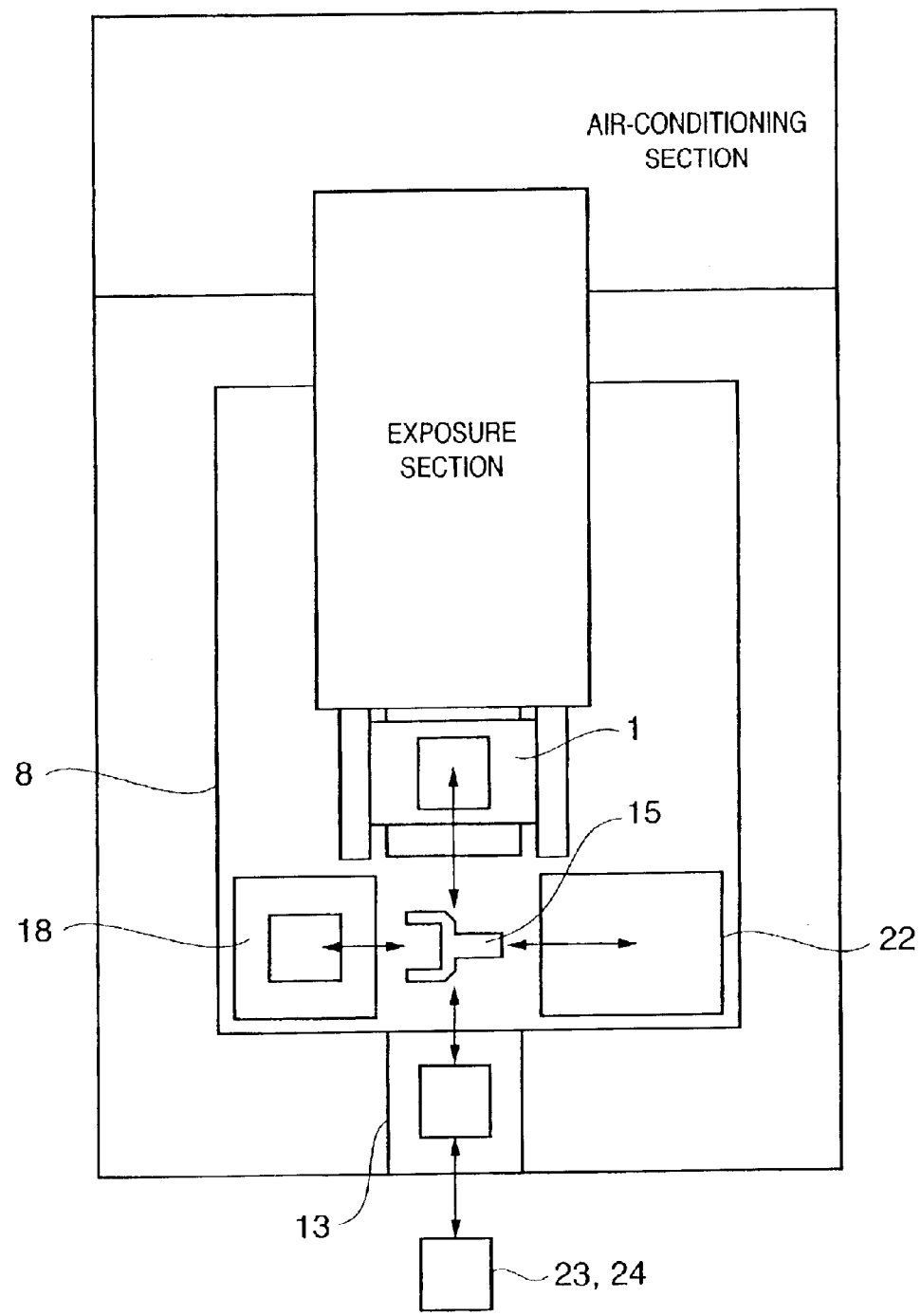

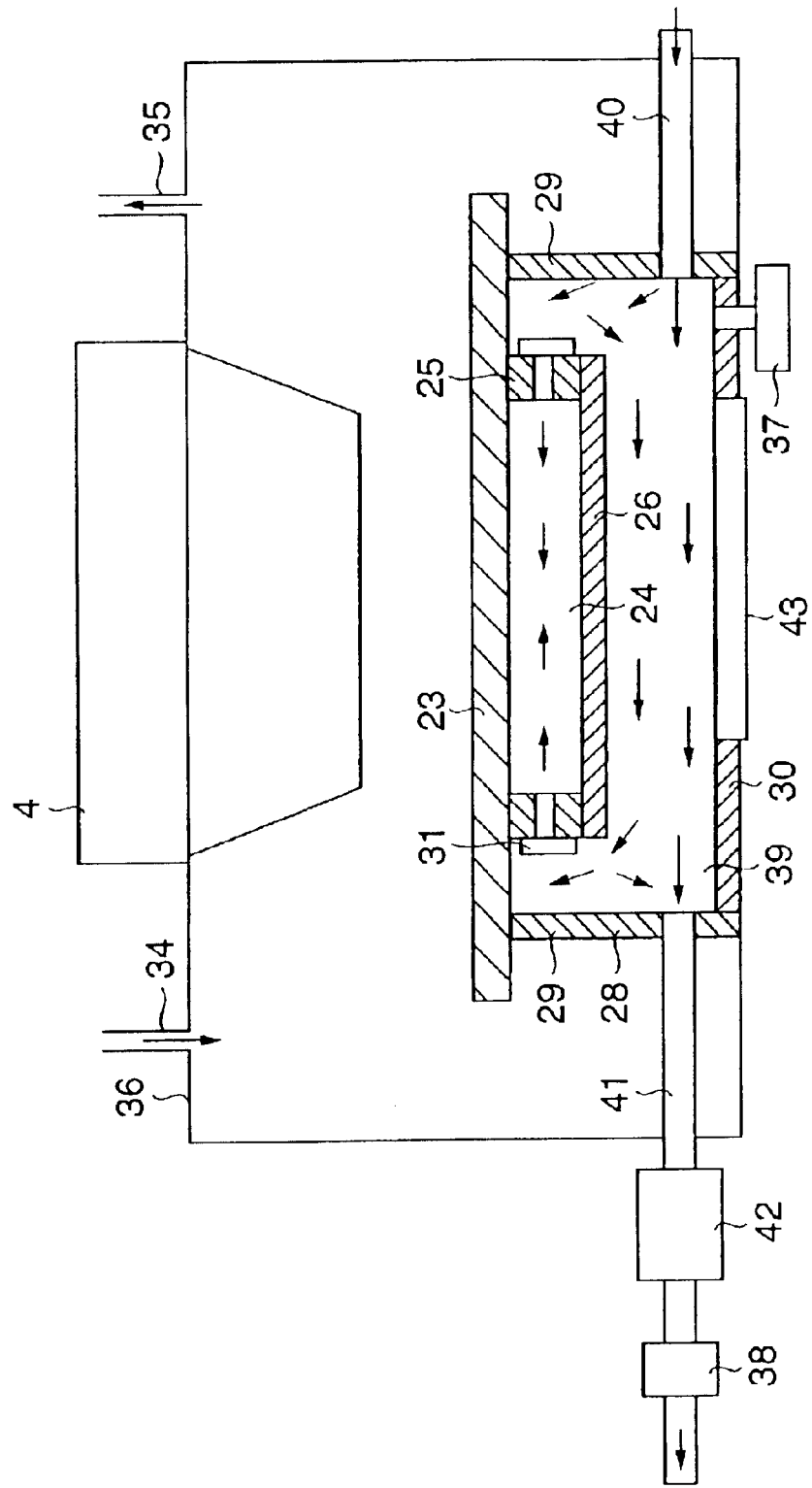

INERT GAS PURGE METHOD AND APPARATUS, EXPOSURE APPARATUS, RETICLE STOCKER, RETICLE INSPECTION APPARATUS, RETICLE TRANSFER BOX, AND DEVICE MANUFACTURING METHOD

FIELD OF THE INVENTION

The present invention relates to an inert gas purge method which is preferably applied to an exposure apparatus that uses ultraviolet rays as exposure light, purges the interior of the apparatus with inert gas, and projects the pattern of a master such as a mask onto a photosensitive substrate via a projection optical system, and which purges with inert gas a pellicle space defined by a master and a pellicle used to prevent deposition of a foreign matter on a pattern surface. The present invention also relates to an exposure apparatus having an inert gas purge apparatus for purging the pellicle space with inert gas. The present invention further relates to a reticle stoker, reticle inspection apparatus, reticle transfer box, and device manufacturing method using the inert gas purge apparatus.

BACKGROUND OF THE INVENTION

A conventional manufacturing process for a semiconductor element such as an LSI or VLSI formed from a micropattern uses a reduction type projection exposure apparatus for printing and forming by reduction projection a circuit pattern drawn on a master such as a mask onto a substrate coated with a photosensitive agent. With an increase in the packaging density of semiconductor elements, demands have arisen for further micropatterning. Exposure apparatuses are coping with micropatterning along with the development of a resist process.

A means for increasing the resolving power of the exposure apparatus includes a method of changing the exposure wavelength to a shorter one, and a method of increasing the numerical aperture (NA) of the projection optical system.

As for the exposure wavelength, a KrF excimer laser with an oscillation wavelength of 365-nm i-line to recently 248 nm, and an ArF excimer laser with an oscillation wavelength around 193 nm have been developed. A fluorine ($F_2$) excimer laser with an oscillation wavelength around 157 nm is also under development.

An ArF excimer laser with a wavelength around ultraviolet rays, particularly, 193 nm, and a fluorine ($F_2$) excimer laser with an oscillation wavelength around 157 nm are known to have a plurality of oxygen ($O_2$) absorption bands around their wavelength bands.

For example, a fluorine excimer laser has been applied to an exposure apparatus because of a short wavelength of 157 nm. The 157-nm wavelength falls within a wavelength region generally called a vacuum ultraviolet region. In this wavelength region, light is greatly absorbed by oxygen molecules, and hardly passes through the air. The fluorine excimer laser can only be applied in an environment in which the atmospheric pressure is decreased to almost vacuum and the oxygen concentration is fully decreased. According to reference "Photochemistry of Small Molecules" (Hideo Okabe, A Wiley-Interscience Publication, 1978, p. 178), the absorption coefficient of oxygen to 157-nm light is about 190 $atm^{-1}$ $cm^{-1}$. This means when 157-nm light passes through gas at an oxygen concentration of 1% at one atmospheric pressure, the transmittance per cm is only $$T=\exp(-190 \times 1 \text{ cm} \times 0.01 \text{ atm})=0.150$$

Oxygen absorbs light to generate ozone ($O_3$), and the ozone promotes absorption of light, greatly decreasing the transmittance. In addition, various products generated by ozone are deposited on the surface of an optical element, decreasing the efficiency of the optical system.

To prevent this, the oxygen concentration in the optical path is suppressed to low level of several ppm order or less by a purge means using inert gas such as nitrogen in the optical path of the exposure optical system of a projection exposure apparatus using a far ultraviolet laser such as an ArF excimer laser or fluorine ($F_2$) excimer laser as a light source.

In such an exposure apparatus using an ArF excimer laser with a wavelength around ultraviolet rays, particularly, 193 nm, or a fluorine ($F_2$) excimer laser with a wavelength around 157 nm, an ArF excimer laser beam or fluorine ($F_2$) excimer laser beam is readily absorbed by a substance. The optical path must be purged to several ppm order or less. This also applies to moisture, which must be removed to ppm order or less.

For this reason, the interior of the exposure apparatus, particularly, the optical path of ultraviolet rays is purged with inert gas. A load-lock mechanism is arranged at a coupling portion between the inside and outside of the exposure apparatus. When a reticle or wafer is to be externally loaded, the interior of the exposure apparatus is temporarily shielded from outside air. After the impurity in the load-lock mechanism is purged with inert gas, the reticle or wafer is loaded into the exposure apparatus.

FIG. 1 is a schematic sectional view showing an example of a semiconductor exposure apparatus having a fluorine ($F_2$) excimer laser as a light source and a load-lock mechanism.

In FIG. 1, reference numeral 1 denotes a reticle stage for setting a reticle bearing a pattern; 2, a projection optical system for projecting the pattern on the reticle onto a wafer serving as a photosensitive substrate; 3, a wafer stage which supports the wafer and is driven in the X, Y, Z, θ, and tilt directions; 4, an illumination optical system for illuminating the reticle with illumination light; 5, a guide optical system for guiding light from the light source to the illumination optical system 4; 6, a fluorine ($F_2$) excimer laser serving as a light source; 7, a masking blade for shielding exposure light so as not to illuminate the reticle except for the pattern region; 8 and 9, housings which cover the exposure optical path around the reticle stage 1 and wafer stage 3, respectively; 10, a He air-conditioner for adjusting the interiors of the projection optical system 2 and illumination optical system 4 to a predetermined He atmosphere; 11 and 12, $N_2$ air-conditioners for adjusting the interiors of the housings 8 and 9 to a predetermined $N_2$ atmosphere; 13 and 14, reticle load-lock chambers and wafer load-lock chambers used to load a reticle and wafer into the housings 8 and 9, respectively; 15 and 16, a reticle hand and wafer hand for transferring the reticle and wafer, respectively; 17, a reticle alignment mark used to adjust the reticle position; 18, a reticle temporary stocker for stocking a plurality of reticles in the housing 8; and 19, a pre-alignment unit for pre-aligning the wafer. If necessary, the overall apparatus is stored in an environment chamber (not shown). Air controlled to a predetermined temperature is circulated within the environment chamber to keep the internal temperature of the chamber constant.

FIG. 2 is a schematic sectional view showing another example of the semiconductor exposure apparatus having a fluorine ($F_2$) excimer laser as a light source and a load-lock mechanism. In FIG. 2, the same reference numerals as in FIG. 1 denote the same parts.

The whole exposure apparatus shown in FIG. 2 is covered with a housing 20, and $O_2$ and $H_2O$ in the housing 20 are purged with N$_2$ gas. Reference numeral 21 denotes an air-conditioner for setting the entire housing 20 in an N$_2$ atmosphere. In this exposure apparatus, the lens barrel of a projection optical system 2 and the internal space of an illumination optical system 4 are partitioned from the internal space (driving system space) of the housing 20, and independently adjusted to a He atmosphere. Reference numerals 13 and 14 denote a reticle load-lock chamber and wafer load-lock chamber used to load a reticle and wafer into the housing 20, respectively.

In general, a reticle is equipped with a pattern protection device called a pellicle. The pellicle prevents deposition of a foreign matter such as dust onto a reticle pattern surface, and suppresses the occurrence of defects caused by transfer of a foreign matter onto a wafer. FIG. 3 is a schematic view showing the structure of a pellicle.

A pellicle 24 is adhered to the pattern surface of a reticle 23 with an adhesive agent or the like. The pellicle 24 is made up of a support frame 25 large enough to surround the reticle pattern, and a pellicle film 26 which is adhered to one end face of the support frame 25 and transmits exposure light. If a space (to be referred to as a pellicle space hereinafter) defined by the pellicle 24 and reticle 23 is completely closed, the pellicle film may expand or contract due to the difference in atmospheric pressure between the inside and outside of the pellicle space or the difference in oxygen concentration. To prevent this, a vent hole 27 is formed in the support frame 25 so as to allow gas from flowing between the inside and outside of the pellicle space. An auto-screen filter (not shown) is attached to the vent hole 27 in order to prevent an external foreign matter from entering the pellicle space via the vent hole 27.

FIG. 4 is a schematic view showing an example of a reticle transfer path in the exposure apparatus shown in FIGS. 1 and 2.

In FIG. 4, reference numeral 22 denotes a foreign matter inspection device which measures the size and number of foreign matters such as dust deposited on the surface of the reticle 23 or pellicle film 26. The reticle 23 is loaded manually or by a transfer device (not shown) into the reticle load-lock chamber 13 serving as the entrance of the exposure apparatus. Since the reticle 23 and pellicle 24 are generally adhered outside the exposure apparatus, the pellicle 24 has already been adhered to the loaded reticle 23. The interior of the reticle load-lock chamber 13 is purged with inert gas until the interior reaches an inert gas atmosphere similarly to the housing 8. After that, the reticle 23 is transferred by the reticle hand 15 to any one of the reticle stage 1, reticle temporary stocker 18, and foreign matter inspection device 22.

As described above, an exposure apparatus using ultraviolet rays, particularly, an ArF excimer laser beam or fluorine (F$_2$) excimer laser beam suffers large absorption by oxygen and moisture at the wavelength of the ArF excimer laser beam or fluorine (F$_2$) excimer laser beam. To obtain a sufficient transmittance and stability of an ultraviolet ray, the oxygen and moisture concentrations are reduced and controlled strictly. For this purpose, a load-lock mechanism is arranged at a coupling portion between the inside and outside of the exposure apparatus. When a reticle or wafer is to be externally loaded, the interior of the exposure apparatus is temporarily shielded from outside air. After the impurity in the load-lock mechanism is purged with inert gas, the reticle or wafer is loaded into the exposure apparatus.

To ensure the transmittance and stability of fluorine (F$_2$) excimer laser beam, the whole reticle stage (wafer stage) including the end face of a projection lens and a critical dimension measurement interference optical system is housed in an airtight chamber, and the interior of the chamber is purged with high-purity inert gas. In addition, the load-lock chamber is disposed adjacent to the airtight chamber in order to load/unload a wafer or reticle into/from the airtight chamber while maintaining a constant internal inert gas concentration. A reticle loaded into the load-lock chamber bears a pellicle. If the pellicle space defined by the pellicle, pellicle support frame, and reticle is not purged with inert gas, the transmittance and productivity decrease.

Japanese Patent Laid-Open No. 9-73167 discloses a technique of adhering a reticle and pellicle in advance in an inert gas atmosphere and filling the pellicle space with inert gas at an oxygen concentration of 1% or less. However, the transmittance of 157-nm light is merely 15% per cm in atmospheric-pressure gas at an oxygen concentration of 1%. At present, the air gap between the reticle and the pellicle film is about 6 mm. Even if this air gap is filled with gas at an oxygen concentration of 0.1%, the transmittance of 157-nm light at this air gap is merely 89.2%. The total space distance of an optical path from the light source of the exposure apparatus to a wafer exceeds at least 1 m. To ensure a transmittance of 80% or more in the 1-m space, the oxygen concentration must be suppressed to almost 10 ppmv/v or less, and ideally 1 ppm or less. In the pellicle space, the oxygen concentration must be 1 to 100 ppm or less in terms of the balance with another space and maintenance of the transmittance in the total space distance. This also applies to the moisture and carbon dioxide gas concentrations.

As a method of purging the pellicle space with inert gas, Japanese Patent Laid-Open No. 9-197652 discloses a technique of forming in a pellicle frame an opening for supplying or exhausting gas and a plug for sealing the opening, and filling the space defined by the pellicle frame, pellicle, and reticle with nitrogen in advance. The pellicle transmits oxygen, and when the reticle is left in an oxygen rich space for a long time, e.g., when the reticle is stocked, oxygen enters the pellicle space due to the difference in oxygen concentration from the outside, absorbing exposure light. Closing the pellicle space may deform and damage the pellicle owing to variations in atmospheric pressure.

SUMMARY OF THE INVENTION

The present invention has been made to overcome the conventional drawbacks, and has as its object to provide a technique of effectively purging a space almost closed with a master and pellicle film with inert gas in an exposure apparatus which uses ultraviolet rays as exposure light, purges the interior of the apparatus with inert gas, and projects the pattern of a master onto a photosensitive substrate via a projection optical system.

To overcome the conventional drawbacks and achieve the above object, according to the first aspect of the present invention, there is provided an inert gas purge method characterized in that a plurality of vent holes are formed in a structure obtained by surrounding by a surrounding member a gas purge space to be purged with inert gas, a vessel which forms a space around the structure is filled with the inert gas to cause the inert gas to enter the gas purge space, and the gas purge space is purged with the inert gas.

According to the second aspect of the present invention, there is provided an inert gas purge apparatus characterized in that a plurality of vent holes are formed in a structure obtained by surrounding by a surrounding member a gas purge space to be purged with inert gas, a vessel which forms a space around the structure is filled with the inert gas to cause the inert gas to enter the gas purge space, and the gas purge space is purged with the inert gas.

According to the third aspect of the present invention, there is provided an exposure apparatus characterized in that a space around a substrate is purged with inert gas by using the above-described inert gas purge apparatus, and a pattern is transferred onto the substrate.

According to the fourth aspect of the present invention, there is provided a reticle stocker characterized in that a reticle is stocked by using the above-described inert gas purge apparatus.

According to the fifth aspect of the present invention, there is provided a reticle inspection apparatus characterized in that a reticle is inspected by using the above-described inert gas purge apparatus.

According to the sixth aspect of the present invention, there is provided a reticle transfer box characterized in that a reticle is transferred by using the above-described inert gas purge apparatus.

According to the seventh aspect of the present invention, there is provided a device manufacturing method characterized by comprising the steps of applying a photosensitive material to a substrate, transferring a pattern onto the photosensitive material of the substrate coated with the photosensitive material by using the above-described exposure apparatus, and developing the substrate bearing the pattern.

Other objects and advantages besides those discussed above shall be apparent to those skilled in the art from the description of a preferred embodiment of the invention which follows. In the description, reference is made to accompanying drawings, which form a part hereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

FIG. 4 is a schematic view showing particularly the reticle transfer path of the projection exposure apparatus to which the present invention is preferably applied;

FIG. 8 is a schematic view showing a state in which the first embodiment of the present invention is applied to a reticle stage;

DETAILED DESCRIPTION OF THE PREFERRED EMBODIMENTS

Preferred embodiments of the present invention will be described below.

An exposure apparatus according to embodiments of the present invention is applied to a known exposure apparatus which uses ultraviolet rays as exposure light, purges the interior of the apparatus with inert gas, and projects the pattern of a mask serving as a master onto a photosensitive substrate via a projection optical system.

Ultraviolet rays as exposure light used in the exposure apparatus according to embodiments of the present invention is not limited. As described in BACKGROUND OF THE INVENTION, the present invention is effective for far ultraviolet rays, and particularly, an ArF excimer laser beam with a wavelength around 193 nm and a fluorine ($F_2$) excimer laser beam with a wavelength around 157 nm.

Embodiments of the present invention will be described in detail below with reference to the accompanying drawings.
(First Embodiment)

Figure 5:
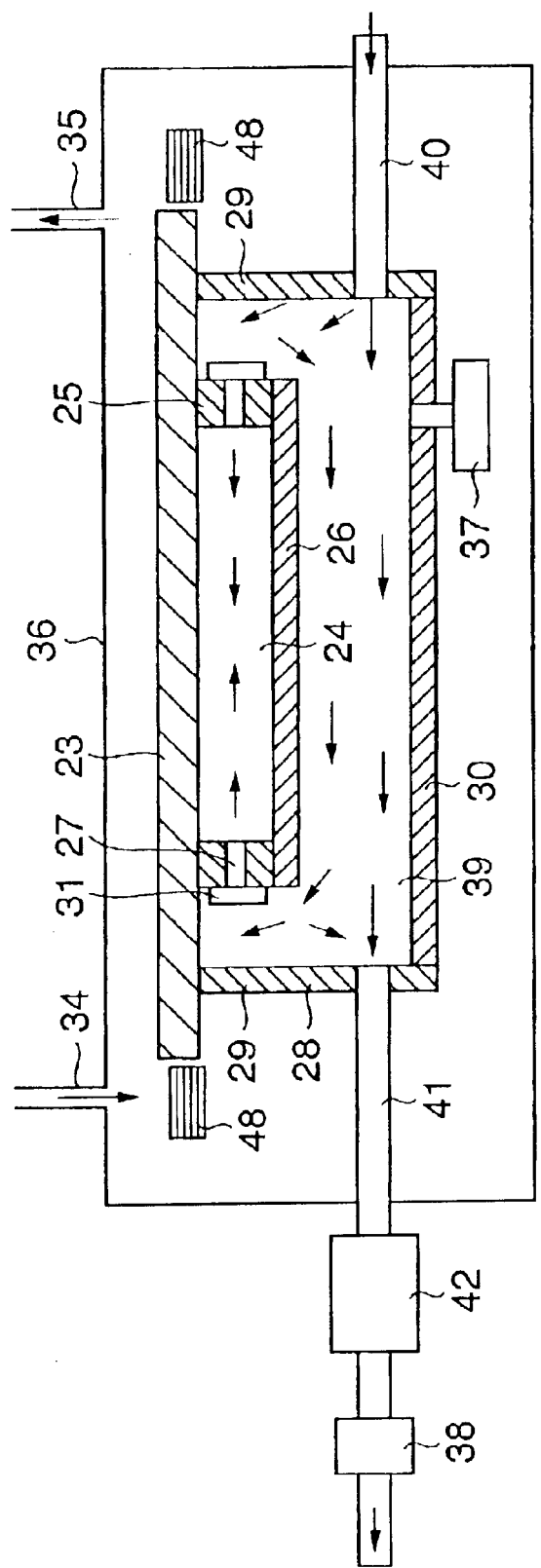
FIG. 5 is a schematic view showing the first embodiment of the present invention.

FIG. 5 is a schematic view showing a purge mechanism for purging a pellicle space with inert gas according to the first embodiment of the present invention.

Figure 1:
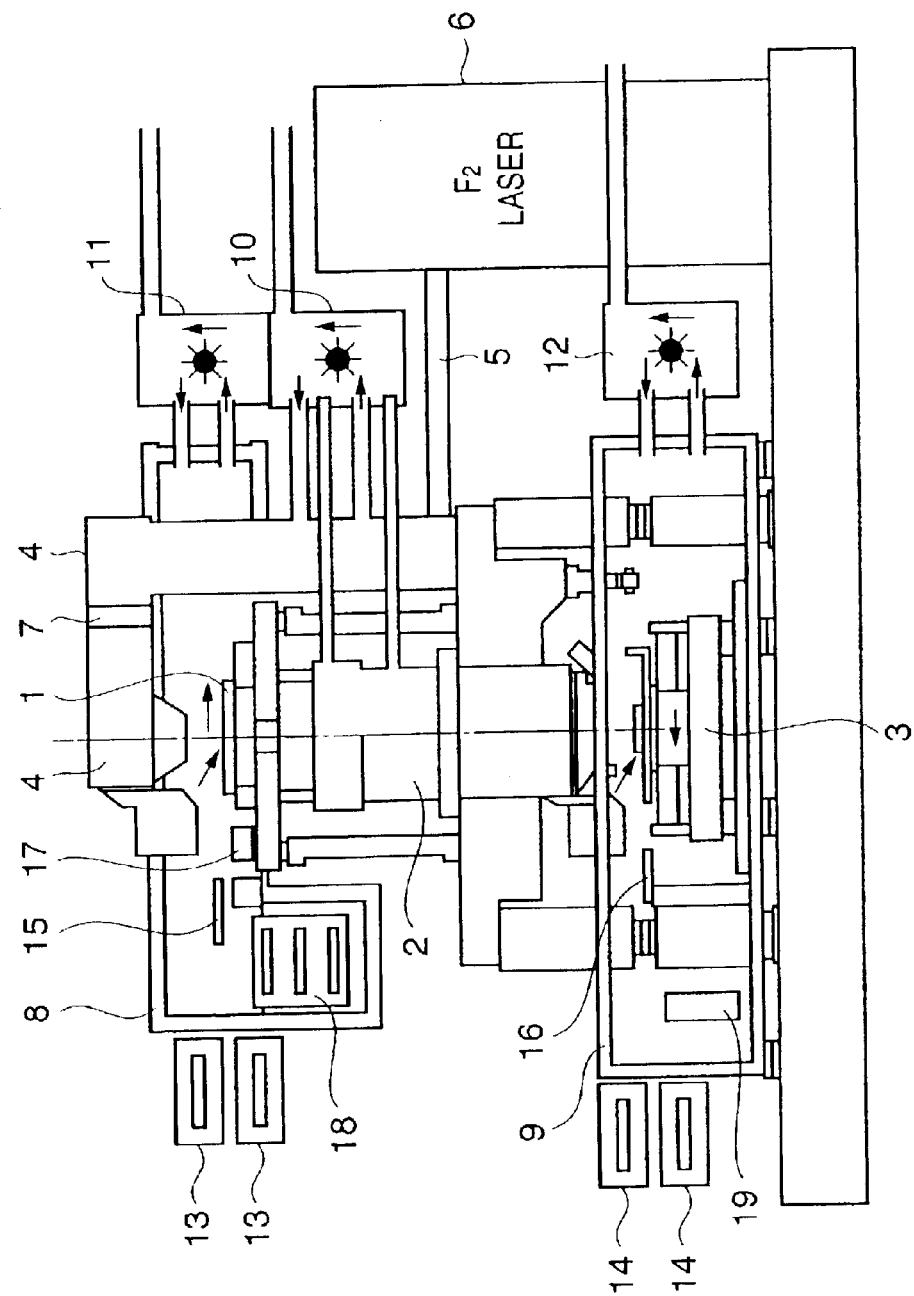
FIG. 1 is a sectional view showing the schematic arrangement of a projection exposure apparatus to which the present invention is preferably applied.
Figure 2:
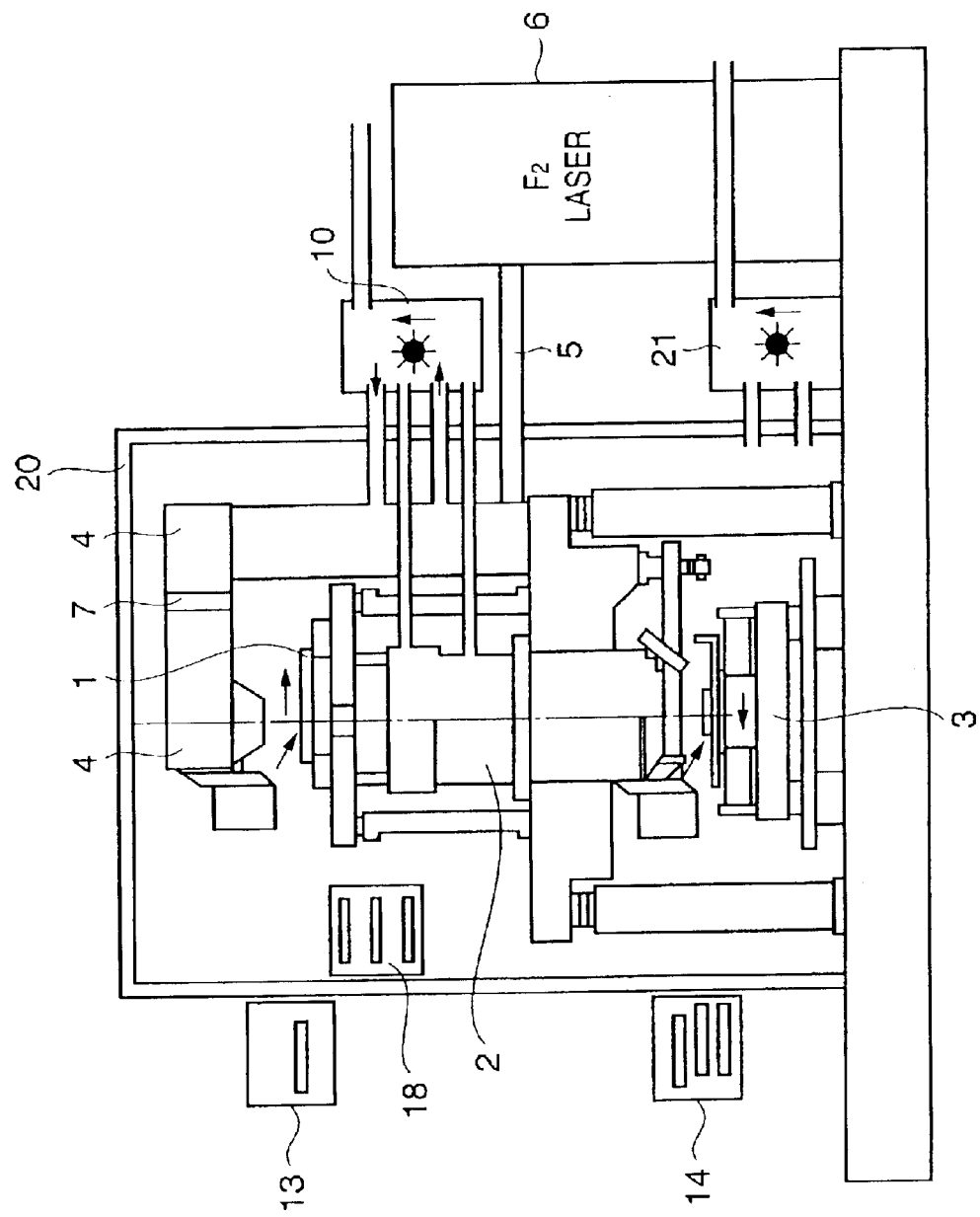
FIG. 2 is a sectional view showing the schematic arrangement of another projection exposure apparatus to which the present invention is preferably applied.
Figure 3:
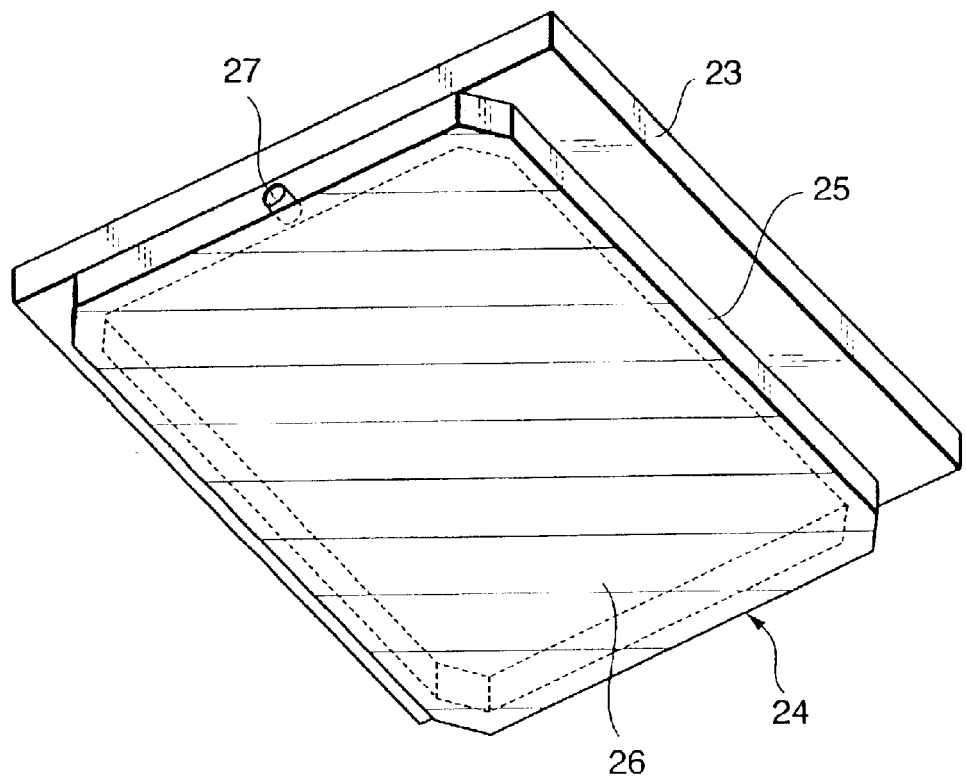
FIG. 3 is a perspective view showing the schematic structure of a pellicle adhered to a reticle.

In FIG. 5, an airtight chamber 36 corresponds to a reticle stage 1, or a housing 8 which contains a reticle temporary stocker 18 in FIG. 1. Inert gas is introduced into the airtight chamber 36 via an inert gas supply line 34 and exhausted via an inert gas exhaust line 35, thereby purging the interior of the airtight chamber 36 with inert gas.

The oxygen and moisture concentrations in the airtight chamber 36 should be 1 to 100 ppm, and preferably 10 ppm or less in terms of maintenance of the transmittance for exposure light. However, it is difficult to decrease the oxygen and moisture concentrations to 10 ppm or less because the interior of the airtight chamber 36 is a large-capacity space containing an actuator such as a reticle transfer mechanism (not shown). Reduction of the oxygen and moisture concentrations in the airtight chamber 36 to 10 ppm or less consumes a large amount of inert gas and increases the apparatus operating cost. Thus, in the first embodiment, the oxygen and moisture concentrations in the airtight chamber 36 are set to 100 to 1,000 ppm.

A reticle support 28 is arranged in a reticle temporary stocker 18 within the airtight chamber 36. A reticle 23 to which a pellicle 24 (having a support frame 25 and a pellicle film 26 adhered to one end face of the support frame 25) is adhered is aligned and mounted at a predetermined position on the support 28 manually or by a reticle hand (not shown) or a transfer robot (not shown) outside the airtight chamber 36. If necessary, the support 28 may have a suction groove for sucking and fixing the reticle 23. An alignment mechanism (not shown) for more precisely aligning the reticle 23 on the support 28 can be optionally arranged.

The reticle support 28 is made up of a reticle support portion 29 and bottom surface 30, and has a space capable of housing the pellicle 24 inside the reticle support 28. The reticle 23 is set as a lid on the reticle support 28 to form an almost closed space 39. Inert gas is supplied from an inert gas supply line 40 to the almost closed space 39, and a space around the pellicle frame, pellicle film, and reticle is filled with inert gas.

Inert gas is exhausted outside the chamber 36 from an inert gas exhaust line 41 while being supplied from the inert gas supply line 40 to the almost closed space 39. Purge with high-purity inert gas is kept performed, and high-purity purge can be realized.

Figure 6:
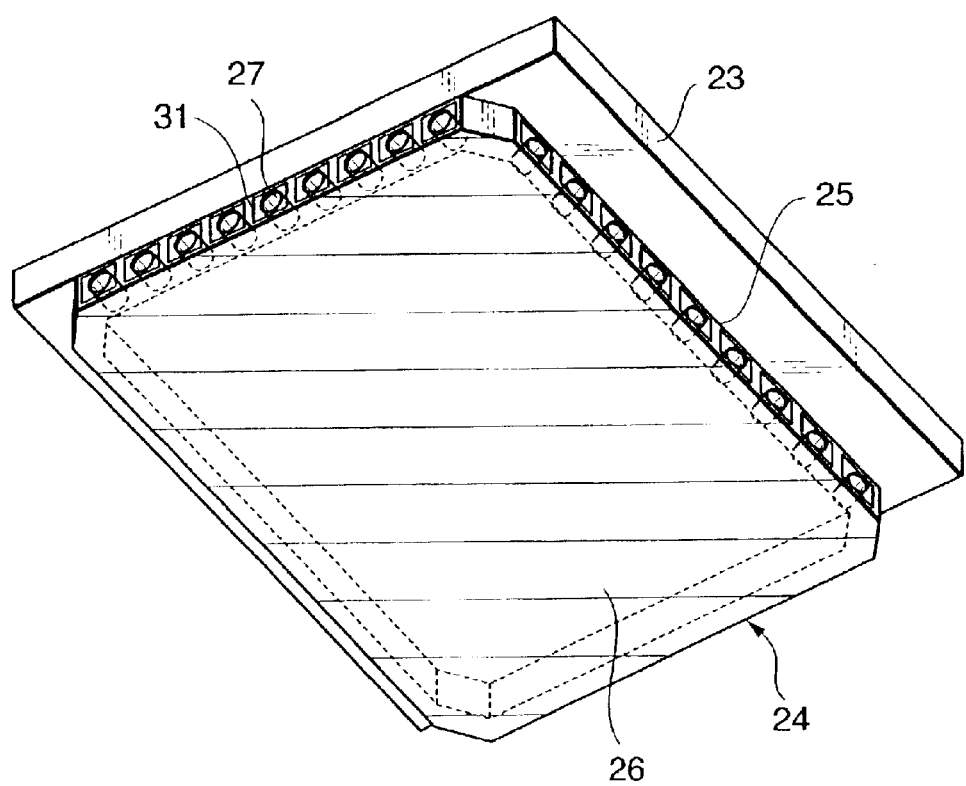
FIG. 6 is a perspective view showing the schematic arrangement of a pellicle adhered to a reticle used in the first embodiment of the present invention.

As shown in FIG. 6, a plurality of vent holes 27 are formed in the pellicle. Inert gas filled in the almost closed space 39 enters the pellicle space via the vent holes 27 of the pellicle frame by gas diffusion. Oxygen and moisture in the pellicle space move outside the pellicle space via the vent holes 27 of the pellicle frame by gas diffusion, and are exhausted from the inert gas exhaust line 41 by the flow of inert gas.

In this way, the inert gas concentration in the pellicle space gradually increases, realizing purge with oxygen and moisture concentrations of 10 ppm or less. Even if the oxygen and moisture concentrations in the airtight chamber 36 are 100 to 1,000 ppm, the oxygen and moisture concentrations in the pellicle space can be reduced to 0 to 100 ppm.

If the pressure in the almost closed space 39 is set positive, entrance of oxygen and moisture from a small gap between the inert gas exhaust line 41 or reticle support 28 and the reticle 23 can be prevented. In the first embodiment, the pressure in the almost closed space 39 is measured by a pressure gauge 37 while inert gas is supplied and exhausted. A restrictor 38 attached to the inert gas exhaust line 41 is so adjusted as to set the pressure in the almost closed space 39 positive.

A higher pressure in the almost closed space 39 can further prevent entrance of oxygen and moisture. However, an excessively high pressure causes floating of the reticle 23. To prevent floating of the reticle 23, a suction groove for sucking and fixing the reticle 23 may be formed in the reticle support 28. Alternatively, a reticle misalignment preventing unit 48 may be arranged. Instead of adjusting the restrictor 38 attached to the inert gas exhaust line 41, any one of or a combination of the inert gas supply amount, inert gas supply speed, inert gas supply pressure, inert gas exhaust amount, inert gas exhaust speed, and inert gas exhaust pressure may be controlled by a controller (not shown) on the basis of the value of the pressure gauge 37, thereby setting the pressure in the almost closed space 39 positive.

Simultaneously when or before the reticle 23 is set at a predetermined position on the support 28 manually or by a reticle hand (not shown) or a transfer robot (not shown) arranged outside the airtight chamber 36, inert gas is supplied from the inert gas supply line 40 to the almost closed space 39. The supplied inert gas flows through the almost closed space 39 and is exhausted from the inert gas exhaust line 41. At this time, the oxygen and moisture concentrations in the almost closed space 39 are measured by an oxygen/moisture concentration meter 42 inserted in the inert gas exhaust line 41.

On the initial stage of purge, the oxygen and moisture concentrations in the almost closed space 39 exhibit 100 to 1,000 ppm which is the same as those in the airtight chamber 36. The oxygen and moisture concentrations decrease along with the progress of purge. More specifically, the oxygen and moisture concentrations abruptly decrease within a relatively short time until the atmosphere in the almost closed space 39 is purged with inert gas. After that, the oxygen and moisture concentrations slowly decrease for a relatively long time until oxygen and moisture in the atmosphere within the pellicle space are purged by molecule diffusion. The oxygen and moisture concentrations in the almost closed space 39 and pellicle space can be measured by monitoring the measurement value of the oxygen/moisture concentration meter 42 inserted in the inert gas exhaust line 41.

A relatively large amount of inert gas is supplied to the inert gas supply line 40 by an inert gas flow rate adjusting means (not shown) within a relatively short time until the measurement value by the oxygen/moisture concentration meter 42 reaches a target purge concentration of 0 to 100 ppm for the reticle space. This inert gas supply amount is so determined as to adjust the oxygen and moisture concentrations in the almost closed space 39 to 0 to 100 ppm within almost 1 to 10 min. The flow rate of inert gas supplied to the inert gas supply line 40 is switched by the inert gas flow rate adjusting means (not shown) for a relatively long time after the oxygen and moisture concentrations in the almost closed space 39 reach 0 to 100 ppm. This inert gas supply amount requires only a flow rate capable of maintaining the oxygen and moisture concentrations in the almost closed space 39 at 0 to 100 ppm.

Adjusting the inert gas flow rate on the basis of the measurement value of the oxygen/moisture concentration meter can realize both a small inert gas consumption amount and a high purge speed. In the first embodiment, the volume in the almost closed space 39 is 10 times or less the volume of the pellicle space. To further increase the purge speed, the volume in the almost closed space 39 is set to 10 times or less the pellicle space.

The oxygen and moisture concentrations in the pellicle space can be obtained prior to reticle transfer by sending inert gas concentration information in the pellicle space to a computer (not shown). When a reticle is stocked in the reticle temporary stocker 18, whether to transfer the reticle to the reticle stage can be determined. When a reticle is set on the reticle stage 1, whether to start exposure can be determined or the completion of purge can be predicted.

During reticle transfer, a pellicle purged with inert gas passes through a space having high oxygen and moisture concentrations in the airtight chamber 36. However, the purge concentration in the pellicle space does not decrease within a relatively short time. For example, transfer from the reticle temporary stocker 18 to the reticle stage 1 in the exposure apparatus ends within about 60 sec. Compared to this time, the diffusion speed of oxygen and moisture molecules is much lower. Since a filter is adhered to an equalizing hole formed in the pellicle frame, the atmosphere in the pellicle space is hardly purged during transfer.

Figure 7:
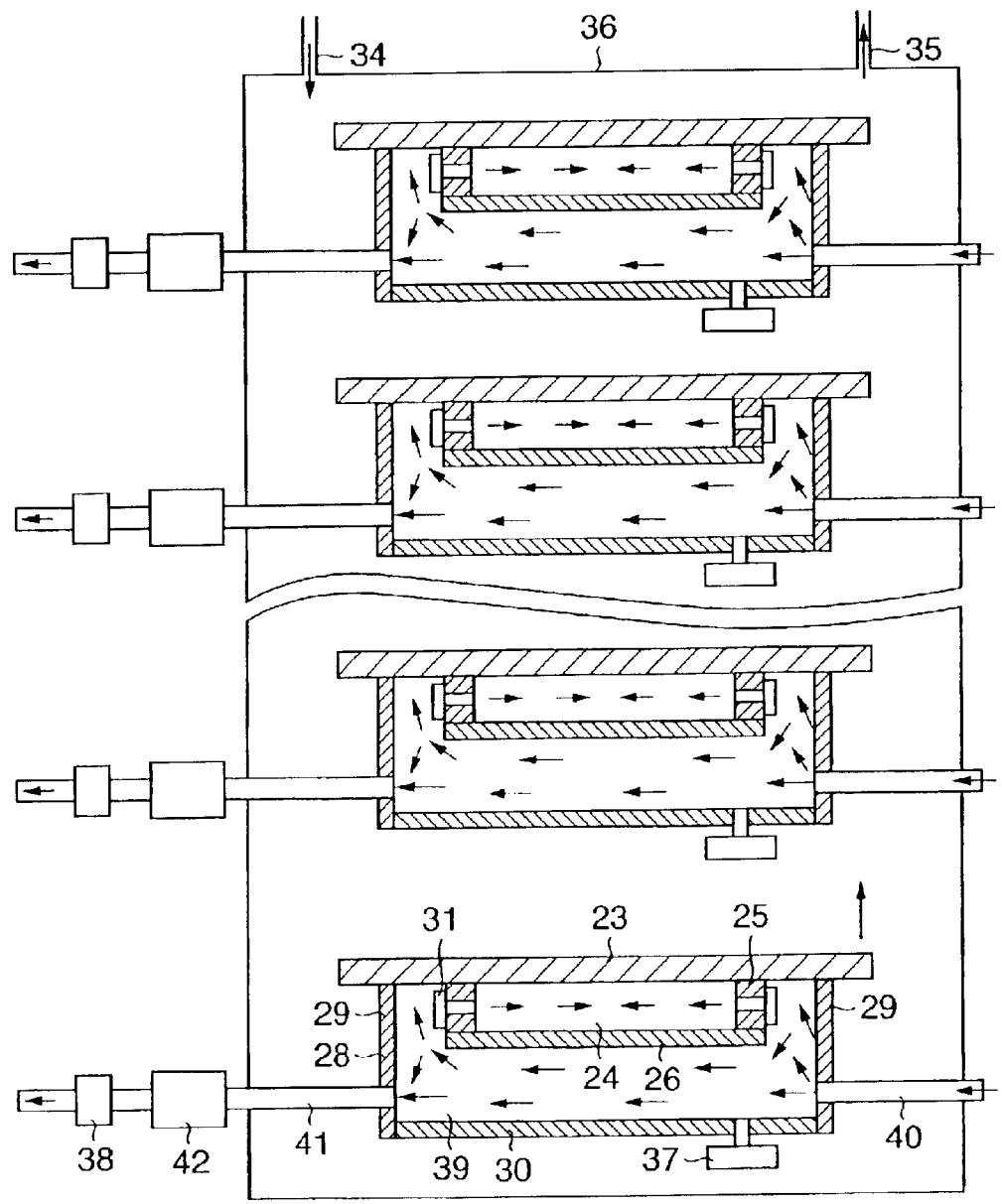
FIG. 7 is a schematic view showing a state in which the first embodiment of the present invention is applied to a reticle temporary stocker.

FIG. 7 is a schematic view showing a state in which the pellicle space purge mechanism according to the first embodiment is arranged in the reticle temporary stocker 18 within the exposure apparatus.

The pellicle space purge mechanism according to the first embodiment can have a low profile. Thus, a plurality of pellicle space purge mechanisms are arranged on multiple stages in the reticle temporary stocker 18. Each pellicle space purge mechanism purges the pellicle space with inert gas during the standby time till exposure. Also in this case, even if the oxygen and moisture concentrations in the airtight chamber 36 are 100 to 1,000 ppm, the oxygen and moisture concentrations in the pellicle space can be reduced to 0 to 100 ppm. Since the mechanisms on multiple stages are independent of each other, loading or unloading of a reticle into or from the reticle temporary stocker does not decrease other purge concentrations. Pellicle space purge mechanisms may be arranged horizontally. Alternatively, Pellicle space purge mechanisms may be arranged vertically and horizontally. After the completion of purge, a reticle can be transferred onto the reticle stage. After a reticle is unloaded from the pellicle space purge mechanism according to the first embodiment, a lid may be set in place of the reticle.

FIG. 8 is a schematic view showing a state in which the pellicle space purge mechanism according to the first embodiment is arranged on the reticle stage 1 within the exposure apparatus.

When the pellicle space purge mechanism is arranged on the reticle stage, seal glass 43 is attached to the bottom surface 30 of the reticle support 28 to ensure the purge space and transmit exposure light. On the reticle stage, the pellicle space can be purged with inert gas even during exposure. Since the volume subjected to high-concentration purge is small, the purge speed in the almost closed space 39 can be increased, and $N_2$ consumption can be reduced. After the completion of purge, exposure can be started.

(Second Embodiment)

Figure 9A:
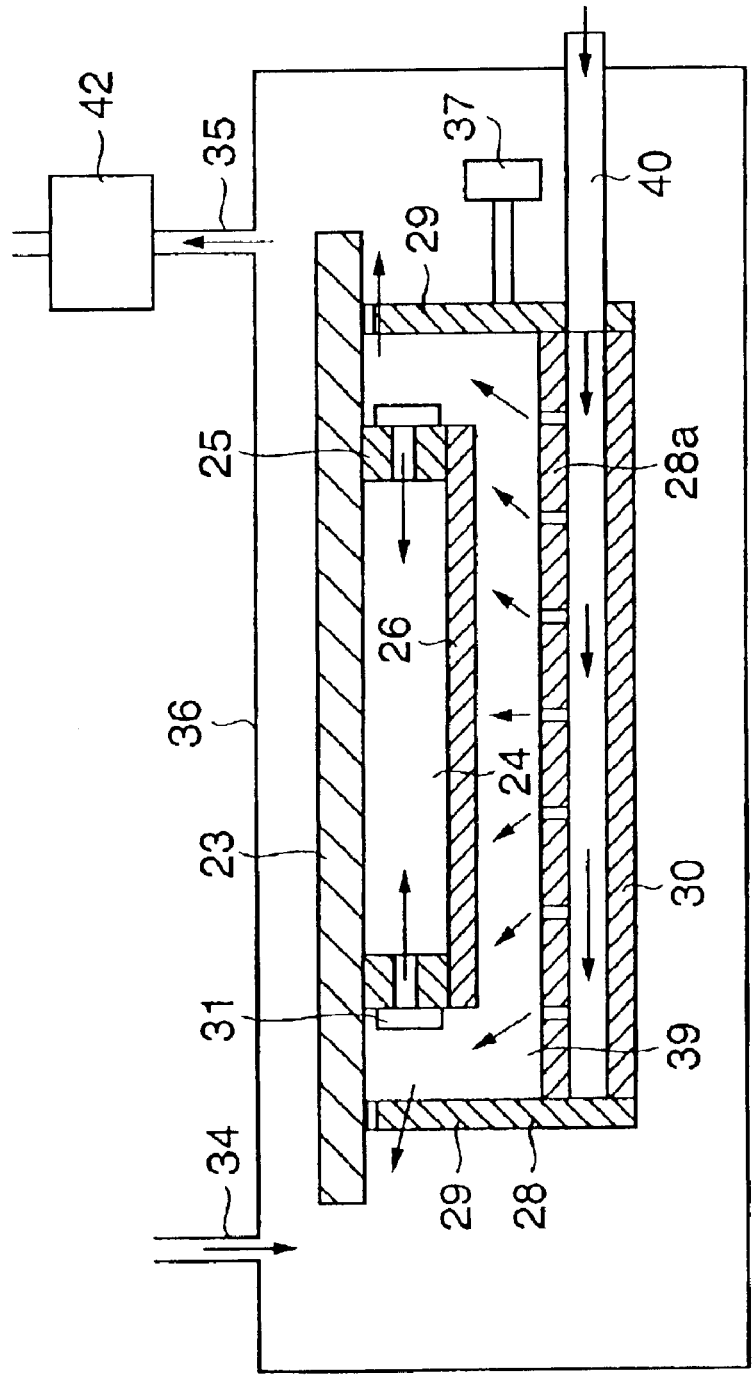
FIG. 9A is a schematic sectional view showing the second embodiment of the present invention.

In the first embodiment, inert gas filled in the almost closed space 39 is exhausted from the inert gas exhaust line 41. It is also possible to form a small gap between a reticle 23 and a reticle support 28, and exhaust inert gas from the gap. The second embodiment of the present invention will be described with reference to FIG. 9A (sectional view).

Inert gas is supplied from an inert gas supply line 40 to the reticle support 28. The supplied inert gas enters an almost closed space 39 via a perforated plate 28a. Inert gas having passed through the perforated plate 28a can be uniformly supplied into the almost closed space 39.

Figure 9B:
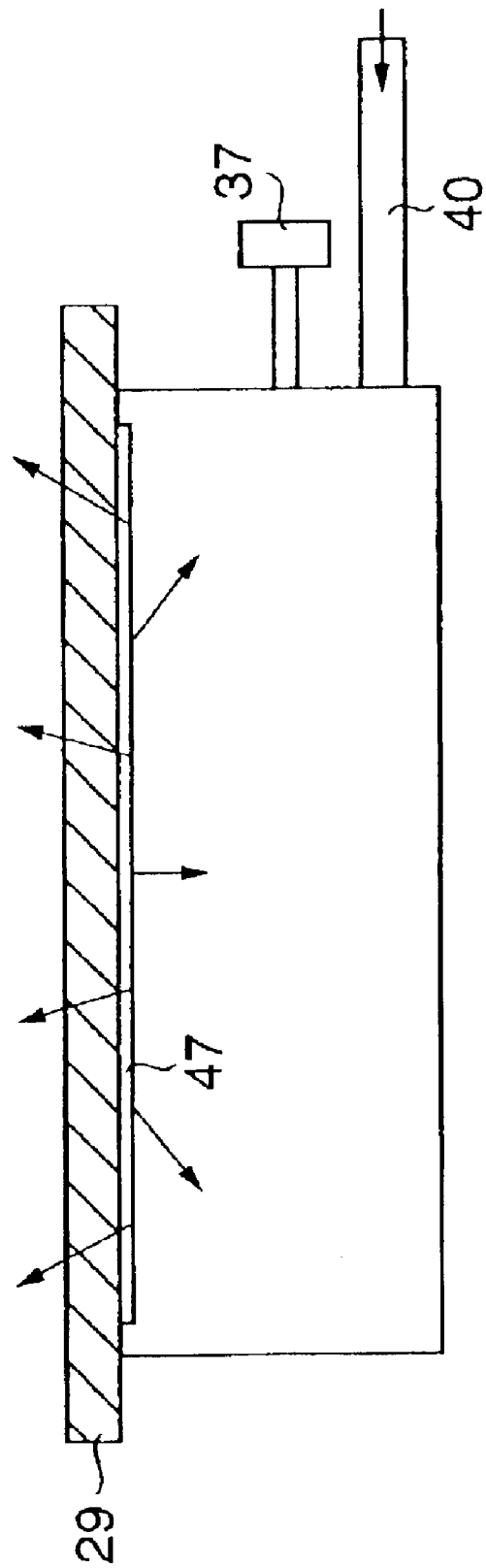
FIG. 9B is a schematic side view showing the second embodiment of the present invention.

A reticle support portion 29 of the reticle support 28 supports the reticle 23 at three or four portions. As shown in FIG. 9B (side view), a small gap is formed except portions 47 in contact with the reticle 23. The almost closed space 39 is set at a positive pressure by the pressure loss when inert gas is exhausted from the small gap. The gap size is preferably 1 mm or less, and more preferably 10 to 100 µm in order to suppress the inert gas consumption amount.

A plurality of vent holes 27 are formed in the pellicle, as shown in FIG. 6. Inert gas filled in the almost closed space 39 enters the pellicle space via the vent holes 27 of the pellicle frame by gas diffusion. Oxygen and moisture in the pellicle space move outside the pellicle space via the vent holes 27 of the pellicle frame by gas diffusion, and are exhausted from the small gap between the reticle 23 and the reticle support 28 by the flow of inert gas. The inert gas concentration in the pellicle space gradually increases, realizing purge with oxygen and moisture concentrations of 10 ppm or less. In the second embodiment, the reticle support portion 29 and reticle 23 are in contact with each other at three or four portions, and a foreign matter is hardly deposited on the lower surface of the pellicle due to contact, compared to a case wherein the reticle support portion 29 and reticle 23 are in full contact with each other.

(Third Embodiment)

Figure 10:
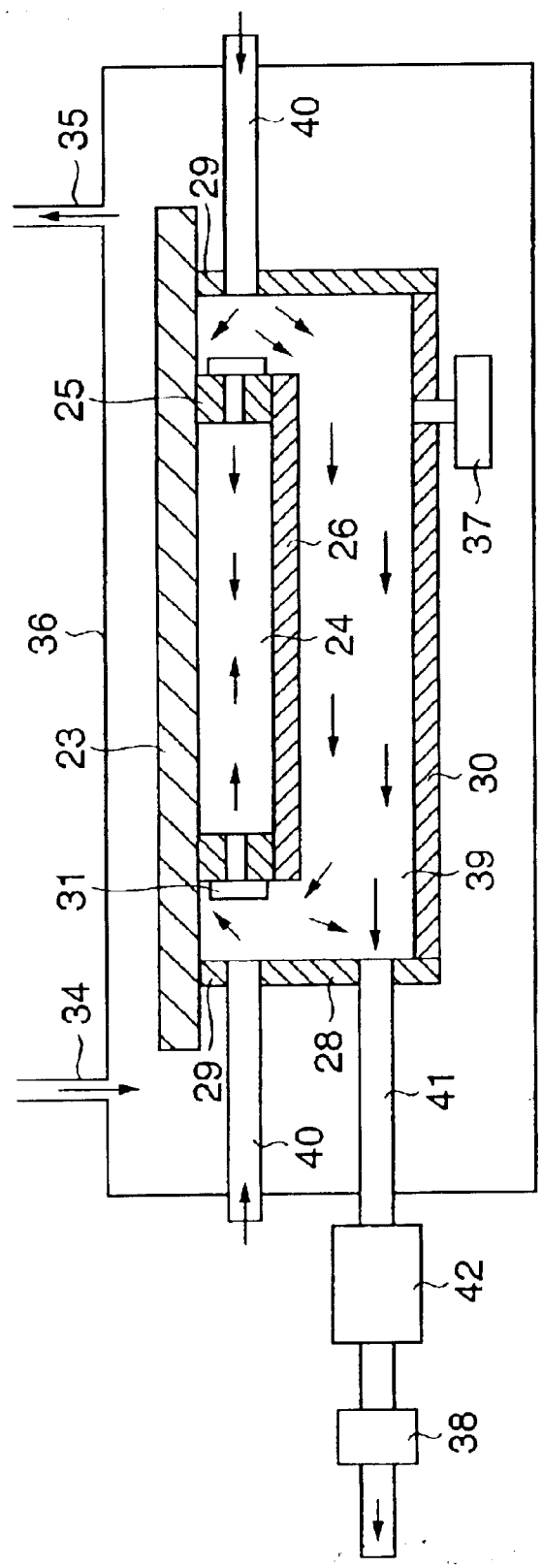
FIG. 10 is a schematic view showing the third embodiment of the present invention.

In the first and second embodiments, inert gas is supplied into the almost closed space 39 from an arbitrary portion or from below the almost closed space 39. Inert gas may be supplied into an almost closed space 39 from the vicinity of a vent hole 27 of the pellicle frame. The third embodiment of the present invention will be explained with reference to FIG. 10.

Figure 11:
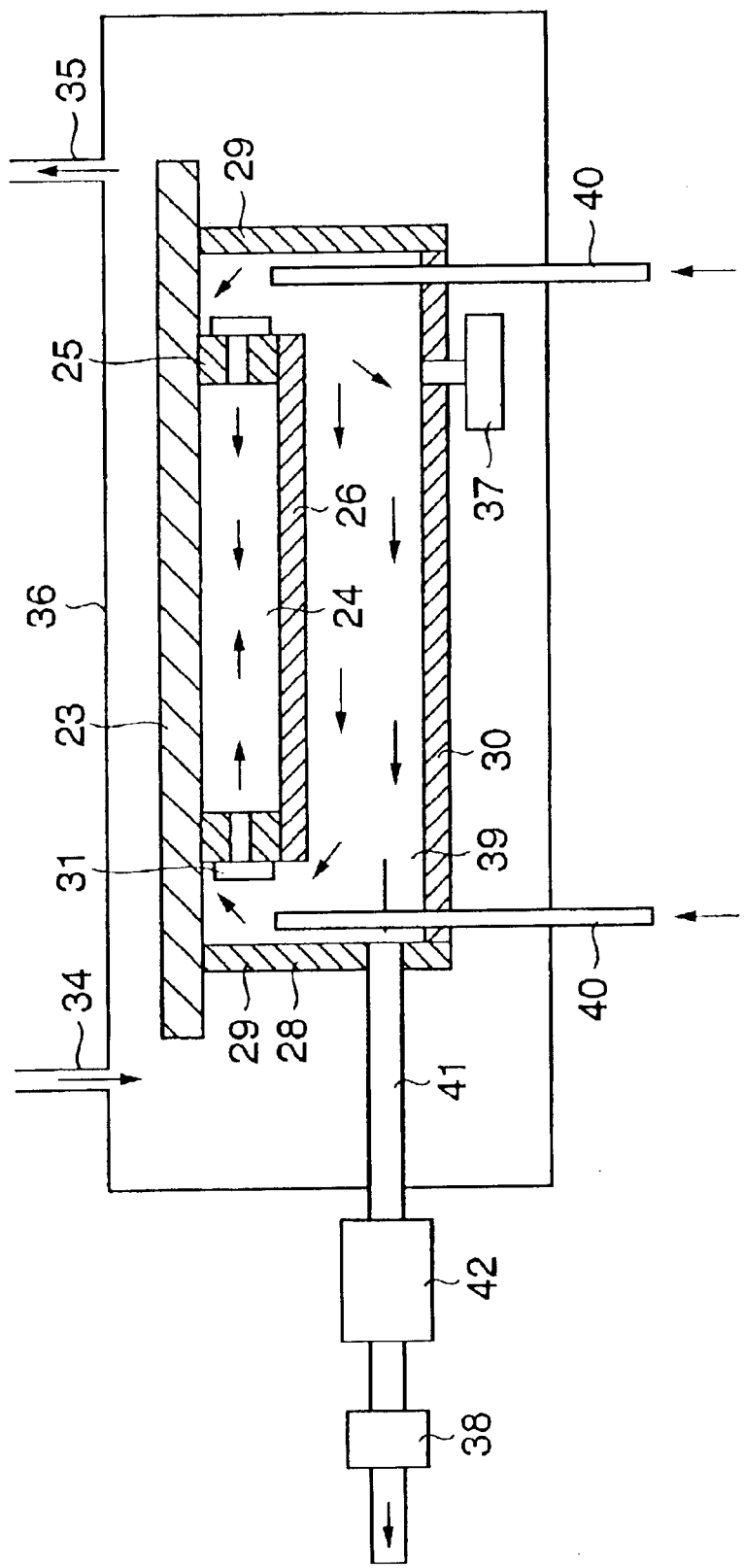
FIG. 11 is a schematic view showing another example of the inert gas supply position in the third embodiment of the present invention.

Inert gas is supplied from an inert gas supply line 40 to the almost closed space 39. At this time, inert gas is supplied from the vicinity of the vent hole 27 of the pellicle frame. Oxygen and moisture moved outside the pellicle space via the vent hole 27 from the pellicle space by gas diffusion can be efficiently exhausted from the inert gas exhaust port. The inert gas concentration near the vent hole 27 of the pellicle frame can be kept high, and the pellicle space can be efficiently purged. Inert gas may be supplied to the vicinity of the vent hole 27 of the pellicle frame in a direction almost perpendicular to the vent hole 27 of the pellicle frame, as shown in FIG. 11.

Methods of supplying and exhausting inert gas into and from the almost closed space 39 according to respective embodiments of the present invention are not limited to those of the embodiments. A combination of arbitrary methods can also yield the pellicle space purge effect.

(Fourth Embodiment)

Figure 12:
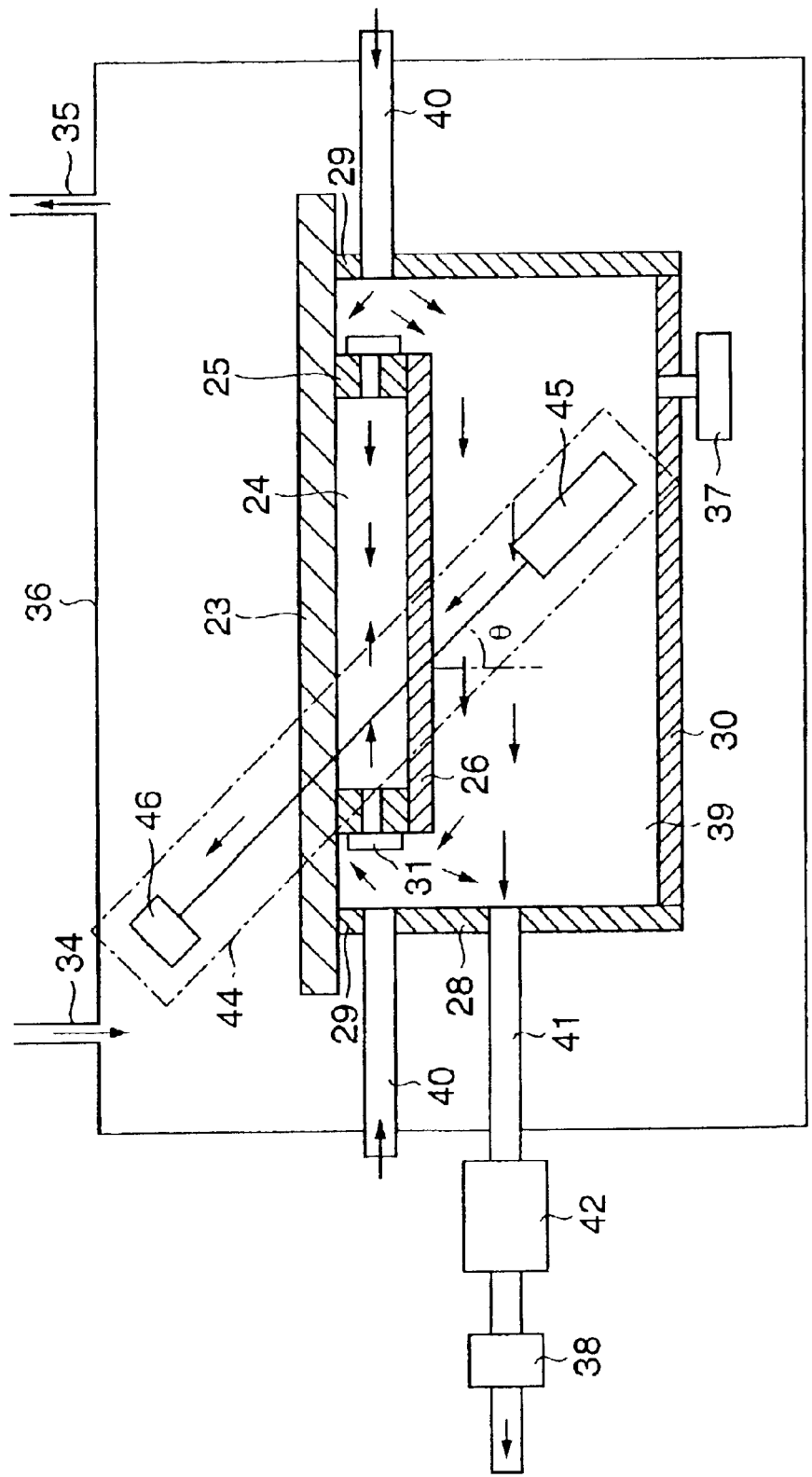
FIG. 12 is a schematic view showing the fourth embodiment of the present invention.

In the first embodiment, the oxygen and moisture concentrations in the almost closed space 39 are measured when the oxygen and moisture concentrations in the pellicle space are measured. Alternatively, the oxygen and moisture concentrations in the pellicle space may be directly measured. FIG. 12 is a schematic view showing an embodiment of directly measuring the oxygen and moisture concentrations in the pellicle space.

In the fourth embodiment, as shown in FIG. 12, a pellicle space impurity detection device 44 is so arranged as to sandwich a reticle 23 and pellicle 24. The pellicle space impurity detection device 44 is constituted by a light-projecting portion 45 and light-receiving portion 46. The light-projecting portion 45 splits a beam from a fluorine excimer laser serving as the light source of the exposure apparatus, and guides the beam through a fiber.

In general, a fluorine excimer laser beam greatly attenuates within a fiber, and thus this embodiment uses a quartz hollow fiber with a high transmittance. The distal end of the fiber is equipped with an optical component (not shown) such as a collimator lens, which shapes light having passed through the fiber into narrow collimated light.

A window not covered with a chromium film is formed in a chromium pattern portion where light having passed through the fiber impinges on the reticle 23. Light incident on the reticle 23 via the window reaches the light-receiving portion 46 without any influence of the chromium pattern. The light-receiving portion 46 is formed from a sensor such as a photodiode for measuring the light quantity.

The pellicle space impurity detection device 44 according to the fourth embodiment calculates the oxygen and moisture concentrations by detecting the light quantity attenuated by oxygen and moisture within the pellicle space while a fluorine excimer laser beam emitted by the light-projecting portion 45 enters the light-receiving portion 46.

The photodiode of the light-receiving portion 46 used in the fourth embodiment outputs a current value corresponding to an input light quantity. An initial light quantity without any attenuation in the pellicle space is measured in advance, and an output current value is represented by Ia. Letting Ib be the output current value for a light quantity attenuated by oxygen and moisture in the pellicle space, a transmittance T in the pellicle space is given by $$T=Ib/Ia$$

Since the absorption coefficient of oxygen to 157-nm light is about 190 $atm^{-1}$ $cm^{-1}$, an oxygen/moisture concentration N at one atmospheric pressure is calculated by $$N=ln\{T/(-190 \times l)\}$$

where l is the distance by which light has passed through the pellicle space.

When a fluorine excimer laser beam emitted by the light-projecting portion 45 is parallel incident on the pellicle support frame 25 at an angle of θ with respect to the normal of a pellicle plane, and the height of the pellicle support frame 25 is represented by So, l=So/cos θ. From this, the oxygen/moisture concentration N is calculated by $$N = ln\{(Ib/Ia)/(-190 \times (So/\cos \theta))\}$$

In this manner, the oxygen/moisture concentration is calculated by detecting a light quantity attenuated by oxygen and moisture in the pellicle space while a fluorine excimer laser beam emitted by the light-projecting portion 45 enters the light-receiving portion 46.

The pellicle space impurity detection device 44 of the fourth embodiment uses a branched fluorine excimer laser serving as the light source of the exposure apparatus. The apparatus becomes more compact and is superior in cost, compared to a case in which the same function is attached to an apparatus other than the exposure apparatus. The same function can also be obtained in the use of, e.g., a 172-nm xenon excimer lamp as a projection lamp.

(Fifth Embodiment)

In the above embodiments, the pellicle space purge mechanism is arranged in the semiconductor exposure apparatus. The pellicle space purge mechanism according to the present invention may be arranged in an apparatus other than the semiconductor exposure apparatus, for example, in a reticle stocker for stocking reticles in the clean room of a device manufacturer, or a reticle transfer box for transferring reticles in the clean room.

When the pellicle space purge mechanism is arranged in the reticle stocker, a space much smaller in volume in comparison with inert gas purge of the entire reticle stocker is purged, and the consumption amount of inert gas for use is small. Since mechanisms in the reticle stocker are independent of each other, loading or unloading of a reticle into or from the reticle temporary stocker does not decrease other purge concentrations. In the reticle stocker, pellicle space purge mechanisms are desirably arranged vertically and horizontally.

When the pellicle space purge mechanism is arranged in the reticle transfer box, the pellicle space can be purged with inert gas during transfer between exposure apparatuses or to the reticle stocker. At this time, a space much smaller in volume in comparison with inert gas purge of the entire reticle transfer area or reticle transfer box is purged, and the consumption amount of inert gas for use is small.

In the above embodiments, the pellicle space purge mechanism is arranged in a purge chamber purged to 100 to 1,000 ppm. The pellicle space can be purged regardless of the ambient oxygen and moisture concentrations. For example, even in air at an oxygen concentration of about 20%, a desired pellicle space can be purged.

(Device Manufacturing Method)

A semiconductor device manufacturing process using the exposure apparatus according to the first to fifth embodiments will be explained.

Figure 13:
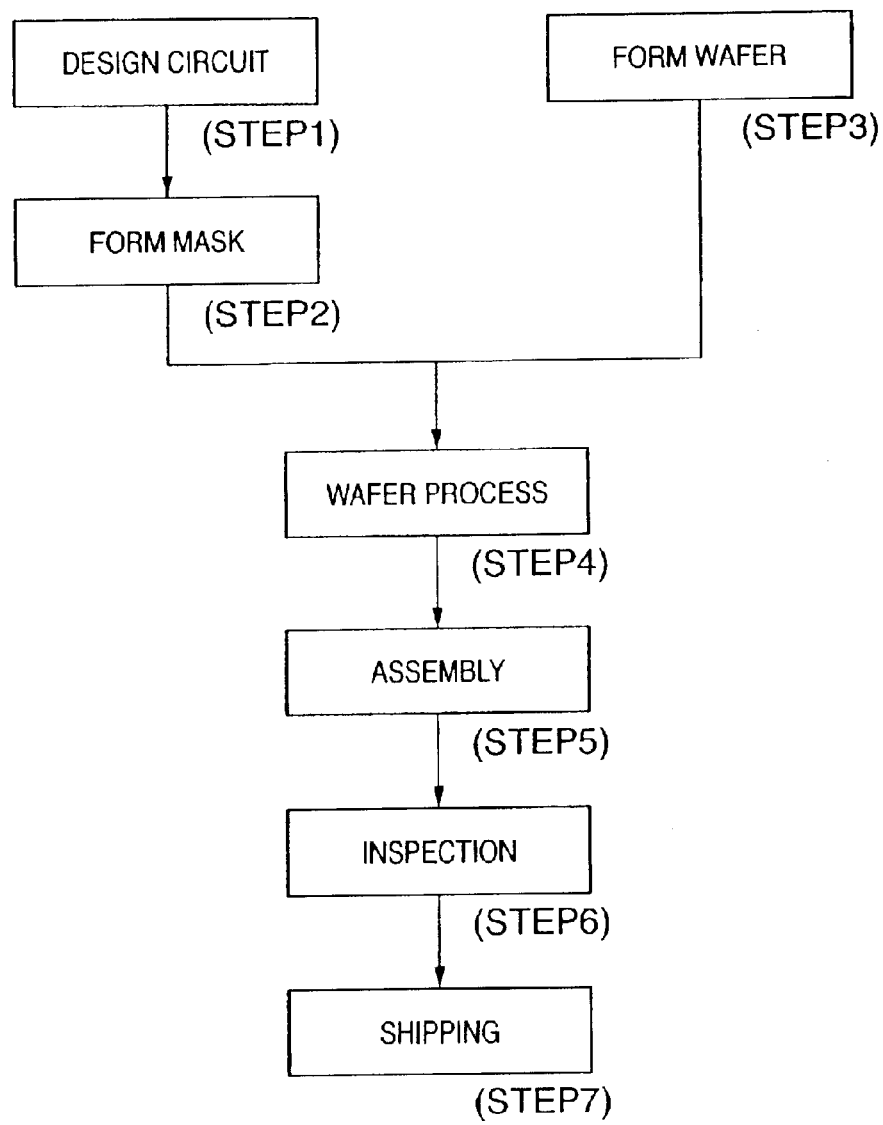
FIG. 13 is a flow chart showing the whole manufacturing process of a semiconductor device.

FIG. 13 shows the flow of the whole manufacturing process of a semiconductor device. In step 1 (circuit design), a semiconductor device circuit is designed. In step 2 (mask formation), a mask is formed based on the designed circuit pattern. In step 3 (wafer formation), a wafer is formed using a material such as silicon. In step 4 (wafer process) called a pre-process, an actual circuit is formed on the wafer by lithography using the mask and wafer. Step 5 (assembly) called a post-process is the step of forming a semiconductor chip by using the wafer formed in step 4, and includes an assembly process (dicing and bonding) and packaging process (chip encapsulation). In step 6 (inspection), the semiconductor device manufactured in step 5 undergoes inspections such as an operation confirmation test and durability test. After these steps, the semiconductor device is completed and shipped (step 7).

Figure 14:
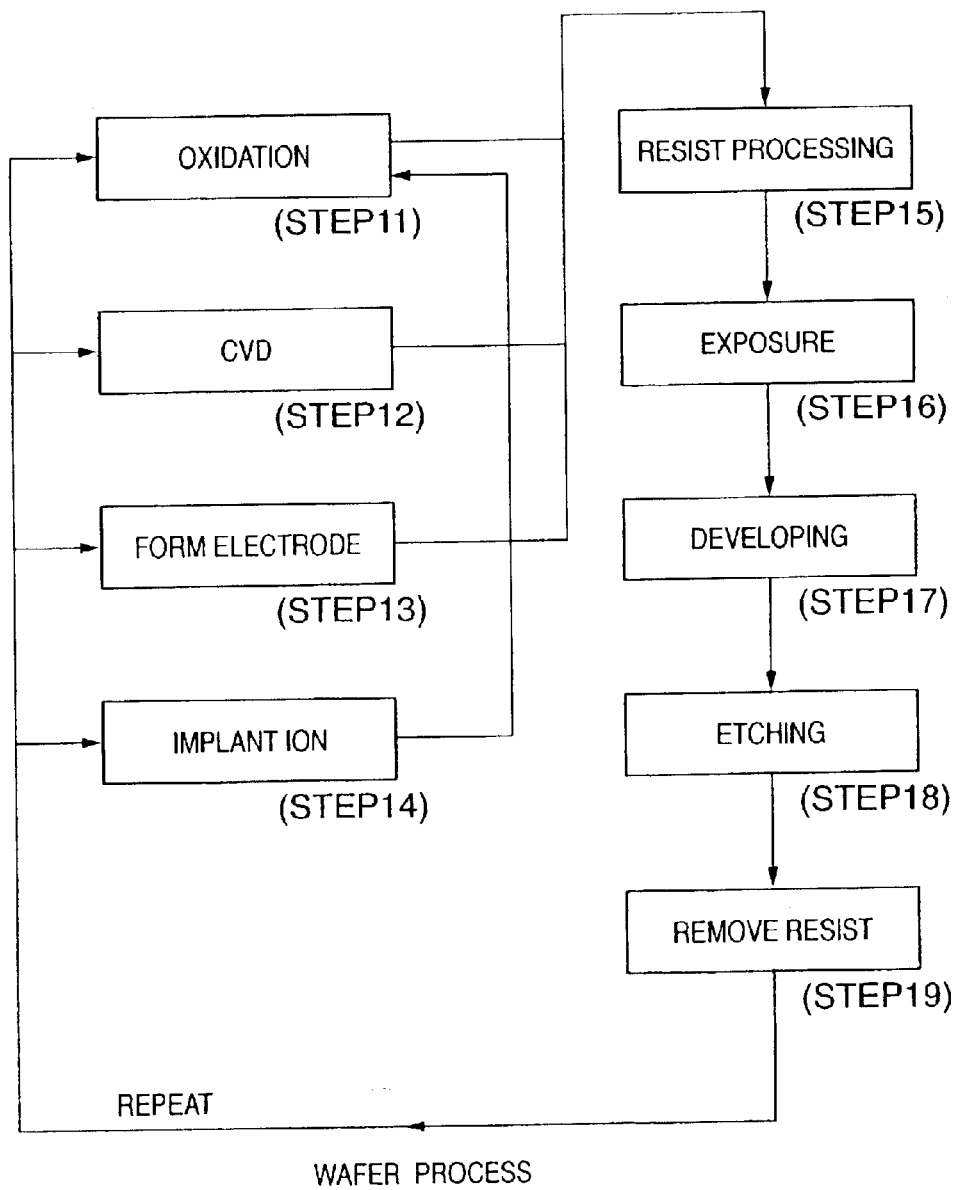
FIG. 14 is a flow chart showing the detailed wafer process in FIG. 13.

FIG. 14 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus transfers a circuit pattern to the wafer. In step 17 (developing), the exposed wafer is developed. In step 18 (etching), the resist is etched except the developed resist image. In step 19 (resist removal), an unnecessary resist after etching is removed. These steps are repeated to form multiple circuit patterns on the wafer.

As has been described above, according to the above-described embodiments, the pellicle space of a pellicle-attached master can be purged with inert gas in a projection exposure apparatus which uses an ultraviolet source such as a fluorine excimer laser as a light source. Exposure can be stably controlled at high precision without decreasing the productivity of the exposure apparatus. A fine circuit pattern can be stably projected with high quality.

The present invention is not limited to the above embodiments and various changes and modifications can be made within the spirit and scope of the present invention. Therefore, to apprise the public of the scope of the present invention the following claims are made.

What is claimed is:

1. An inert gas purge method characterized in that a plurality of vent holes are formed in a structure obtained by surrounding by a surrounding member a gas purge space to be purged with inert gas, filling a vessel which forms a space around the structure with the inert gas to cause the inert gas to enter the gas purge space, and purging the gas purge space with the inert gas, wherein one surface of the structure is formed from a reticle, and the reticle is used as a lid for closing the vessel.

2. The method according to claim 1, wherein four surfaces of the structure are formed from a pellicle support frame.

3. The method according to claim 1, wherein a supply port for supplying the inert gas and an exhaust port for exhausting the inert gas are formed in the vessel, the inert gas is supplied from the supply port, and gas in the vessel is exhausted from the exhaust port, thereby filling the vessel with the inert gas.

4. The method according to claim 3, wherein the supply port is arranged near the vent holes of the structure.

5. The method according to claim 3, wherein an impurity concentration in the gas purge space is measured, and a flow rate of the inert gas is controlled on the basis of a measurement result.

6. The method according to claim 1, wherein a pressure in the vessel is set positive with respect to a pressure around the vessel.

7. The method according to claim 6, wherein the pressure in the vessel is measured and controlled on the basis of a measurement result.

8. An inert gas purge apparatus characterized in that a plurality of vent holes are formed in a structure obtained by surrounding by a surrounding member a gas purge space to be purged with inert gas, a vessel which forms a space around the structure is filled with the inert gas to cause the inert gas to enter the gas purge space, and the gas purge space is purged with the inert gas wherein one surface of the structure is formed from a reticle, and the reticle is used as a lid for closing the vessel.

9. The apparatus according to claim 8, wherein four surfaces of the structure are formed from a pellicle support frame.

10. The apparatus according to claim 8, wherein a supply port for supplying the inert gas and an exhaust port for exhausting the inert gas are formed in the vessel, the inert gas is supplied from the supply port, and gas in the vessel is exhausted from the exhaust port, thereby filling the vessel with the inert gas.

11. The apparatus according to claim 10, wherein the supply port is arranged near the vent holes of the structure.

12. The apparatus according to claim 10, further comprising measurement means for measuring an impurity concentration in the gas purge space, and control means for controlling a flow rate of the inert gas on the basis of a measurement result.

13. The apparatus according to claim 8, wherein a pressure in the vessel is set positive with respect to a pressure around the vessel.

14. The apparatus according to claim 13, further comprising measurement means for measuring the pressure in the vessel, and control means for controlling the pressure in the vessel on the basis of a measurement result.

15. A reticle stocker characterized in that a reticle is stocked by using an inert gas purge apparatus defined in claim 8.

16. A reticle inspection apparatus characterized in that a reticle is inspected by using an inert gas purge apparatus defined in claim 8.

17. A reticle transfer box characterized in that a reticle is transferred by using an inert gas purge apparatus defined in claim 8.

18. An inert gas purge method characterized in that a plurality of vent holes are formed in a structure obtained by surrounding by a surrounding member a gas purge space to be purged with inert gas, filling, a vessel which forms a space around the structure with the inert gas to cause the inert gas to enter the gas purge space, and purging the gas purge space with the inert gas, wherein a supply port for supplying the inert gas and an exhaust port for exhausting the inert gas are formed in the vessel, the inert gas is supplied from the supply port, and gas in the vessel is exhausted from the exhaust port, thereby filling the vessel with the inert gas, and wherein the reticle is used for the vessel as a lid for closing the vessel, a gap is formed at an abutment portion between the vessel and the reticle, and the gap is used as the exhaust port.

19. An inert gas purge apparatus characterized in that a plurality of vent holes are formed in a structure obtained by surrounding by a surrounding member a gas purge space to be purged with inert gas, a vessel which forms a space around the structure is filled with the inert gas to cause the inert gas to enter the gas purge space, and the gas purge space is purged with the inert gas, wherein a supply port for supplying the inert gas and an exhaust port for exhausting the inert gas are formed in the vessel, the inert gas is supplied from the supply port, and gas in the vessel is exhausted from the exhaust port, thereby filling the vessel with the inert gas, and wherein the reticle is used for the vessel as a lid for closing the vessel, a gap is formed at an abutment portion between the vessel and the reticle, and the gap is used as the exhaust port.

* * * * *